US007987222B1

(12) United States Patent
Hazanchuk et al.

(10) Patent No.: US 7,987,222 B1
(45) Date of Patent: Jul. 26, 2011

(54) METHOD AND APPARATUS FOR IMPLEMENTING A MULTIPLIER UTILIZING DIGITAL SIGNAL PROCESSOR BLOCK MEMORY EXTENSION

(75) Inventors: Asher Hazanchuk, Sunnyvale, CA (US); Benjamin Esposito, Oviedo, FL (US)

(73) Assignee: Altera Corporation, San Jose, CA (US)

( * ) Notice: Subject to any disclaimer, the term of this patent is extended or adjusted under 35 U.S.C. 154(b) by 953 days.

(21) Appl. No.: 10/829,559

(22) Filed: Apr. 22, 2004

(51) Int. Cl.
*G06F 7/38* (2006.01)

(52) U.S. Cl. ....................................... 708/523

(58) Field of Classification Search .......... 708/490, 708/620–632, 523
See application file for complete search history.

(56) References Cited

U.S. PATENT DOCUMENTS

| | | | |
|---|---|---|---|
| 3,800,130 A * | 3/1974 | Martinson et al. | 708/404 |
| 4,709,343 A * | 11/1987 | Van Cang | 708/301 |
| 6,014,684 A * | 1/2000 | Hoffman | 708/620 |
| 6,041,340 A * | 3/2000 | Mintzer | 708/403 |
| 6,425,070 B1 * | 7/2002 | Zou et al. | 712/35 |
| 6,530,010 B1 * | 3/2003 | Hung et al. | 708/523 |
| 6,574,651 B1 * | 6/2003 | Cui et al. | 708/523 |
| 6,711,602 B1 * | 3/2004 | Bhandal et al. | 708/625 |
| 6,907,024 B2 * | 6/2005 | Regis | 708/319 |
| 7,003,542 B2 * | 2/2006 | Devir | 708/520 |
| 7,046,723 B2 * | 5/2006 | Schier et al. | 708/316 |
| 7,127,482 B2 * | 10/2006 | Hou et al. | 708/402 |
| 2004/0267857 A1 * | 12/2004 | Abel et al. | 708/524 |
| 2005/0187997 A1 * | 8/2005 | Zheng et al. | 708/490 |

* cited by examiner

*Primary Examiner* — Chat C Do
(74) *Attorney, Agent, or Firm* — L. Cho

(57) ABSTRACT

A method for performing multiplication on a field programmable gate array includes generating a product by multiplying a first plurality of bits from a first number and a first plurality of bits from a second number. A stored value designated as a product of a second plurality of bits from the first number and a second plurality of bits from the second number is retrieved. The product is scaled with respect to a position of the first plurality of bits from the first number and a position of the first plurality of bits from the second number. The stored value is scaled with respect to a position of the second plurality of bits from the second number and a position of the second plurality of bits from the second number. The scaled product and the scaled stored value are summed.

18 Claims, 10 Drawing Sheets

METHOD AND APPARATUS FOR IMPLEMENTING A MULTIPLIER UTILIZING DIGITAL SIGNAL PROCESSOR BLOCK MEMORY EXTENSION

TECHNICAL FIELD

The present invention relates to field programmable gate arrays (FPGAs) and the implementation of multipliers on FPGAs. More specifically, the present invention relates to a method and apparatus for implementing a multiplier utilizing digital signal processor (DSP) block memory extension.

BACKGROUND

FPGAs may be used to implement large systems that include millions of gates and megabits of embedded memory. Typical FPGAs include a plurality of programmable resources such as logic elements, memory blocks, and DSP blocks. When designing a multiplier on an FPGA, a traditional technique utilized the logic elements on the FPGA to build the multiplier. However, since a large number of logic elements were required to implement the multiplier, this technique resulted in producing a circuit having a large silicon size which was undesirable.

Other approaches used for designing a multiplier on an FPGA included using the DSP blocks on the FPGA. This technique produced a multiplier having a smaller silicon size which was an improvement over the traditional method of using logic elements. DSP blocks, however, have limited multiplier configuration flexibility. For example, a DSP block may support fixed configurations of only 9*9 bit, 18*18 bit, and 36*36 bit multiplication. When a multiplier has a configuration that exceeds a fixed configuration by even one bit, the next high resolution configuration would be required to implement that multiplier on the DSP block. Thus, this approach for multiplier design often resulted in unused multiplier resources on a DSP block. Survey results have indicated that when DSP blocks are used to implement multipliers on an FPGA, on average 75% of multiplier resources on the DSP blocks are unused. Since the number of DSP blocks on an FPGA is limited, this approach was not efficient from a resource utilization standpoint.

Thus, what is needed is an effective and efficient method for implementing multipliers on an FPGA.

SUMMARY

Memory blocks on a FPGA are used to extend the resolution of a DSP block multiplier. For an n*m bit multiplier configuration, the DSP block is used to implement only a subset of the n*m bit multiplication functions. The remaining multiplication functions may be implemented by one or more memory blocks. A memory block may be used to store values that result from n*m bit multiplication functions not performed by the DSP block. Results generated by the DSP block and retrieved from the memory block may be scaled and summed together to generate a result equivalent to the n*m bit multiplication functions. The use of a DSP block memory extension reduces the amount of DSP block multiplier resources needed to implement a multiplier.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
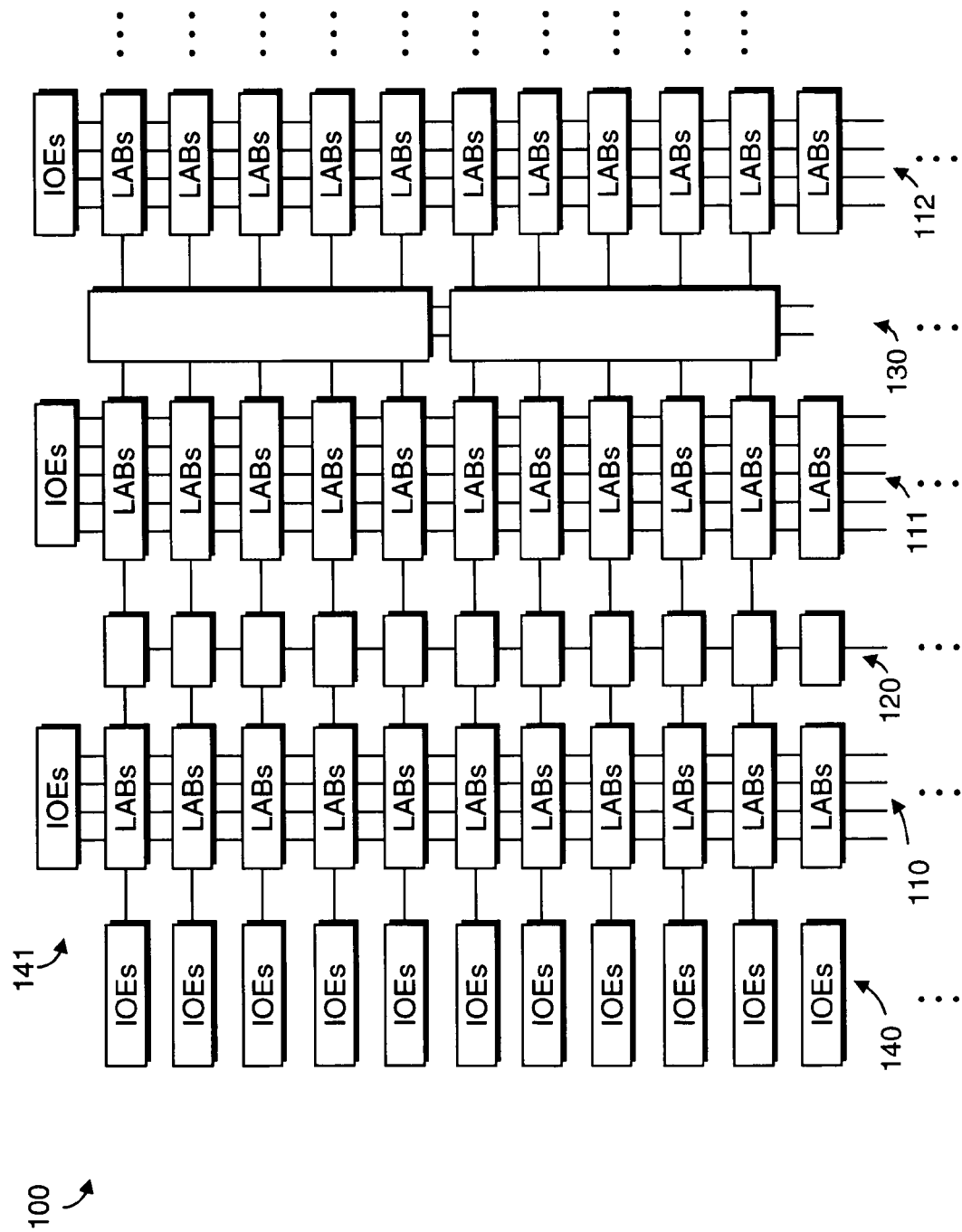
FIG. 1 illustrates a field programmable gate array (FPGA) that is configurable to implement a multiplier according to an embodiment of the present invention.

FIG. 1 illustrates an exemplary field programmable gate array (FPGA) 100 according to an embodiment of the present invention. According to one embodiment, the FPGA 100 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the FPGA 100, an LE may include a 4-input lookup table (LUT) with a configurable flip-flop.

The FPGA 100 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 100. A first column of LABs is shown as 110, a second column of LABs is shown as 111, and a third column of LABs is shown as 112.

The FPGA 100 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the FPGA 100. A column of memory blocks is shown as 120.

The FPGA 100 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the FPGA 100. A column of DSP blocks is shown as 130.

The FPGA 100 includes a plurality of input/output elements (IOEs). Each IOE feeds an I/O pin (not shown) on the target device 100. The IOEs are located at the end of LAB rows and columns around the periphery of the FPGA 100. Each IOE includes a bidirectional I/O buffer and a plurality of registers for registering input, output, and output-enable signals. When used with dedicated clocks, the registers provide performance and interface support with external memory devices. A first column of IOEs are shown as 140, and a first row of IOEs are shown as 141.

The FPGA 100 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The FPGA 100 also includes a plurality of row interconnect lines ("H-type wires") (not shown) that span fixed distances. Dedicated row interconnect lines route signals to and from LABs, DSP blocks, and memory blocks within the same row. The row interconnect lines span a distance of up to four, eight, and twenty-four LABs and are used for fast row connections in a four-LAB, eight-LAB, and twenty-four-LAB region. The row interconnects may drive and be driven by LABs, DSP blocks, RAM blocks, and horizontal IOEs.

The FPGA 100 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines include interconnects that traverse a distance of four, eight, and sixteen blocks in a vertical direction.

FIG. 1 illustrates an exemplary embodiment of an FPGA. It should be appreciated that the FPGA may include components arranged in a manner different than that shown in FIG. 1. An FPGA may also include components other than those described in reference to FIG. 1. Thus, while the invention described herein may be utilized on the architecture described in FIG. 1, it should be appreciated that it may also be utilized on different architectures, such as those employed by Altera® Corporation in its APEX™, and Mercury™ family of chips and those employed by Xilinx®, Inc. in its Virtex™ and Virtex™ II line of chips.

Components on the FPGA 100 may be used to implement an n*m bit multiplier. The multiplier may include a DSP block and one or more memory blocks in the FPGA 100. In one embodiment, the DSP block is used to generate a product (a first decomposition product) by multiplying a first plurality of the n bits from a first number and a first plurality of m bits from a second number. The memory block is used to store values that represent all the combinations of multiplying a second plurality of the n bits from the first number and a second plurality of the m bits from the second number. The memory block may be a look up table that returns a stored value (a second decomposition product) that represents a product of the second plurality of n bits from the first number and the second plurality of m bits from the second number.

The product from the DSP block may be scaled with respect to a position of the first plurality of bits from the first number and a position of the first plurality of bits from the second number. The stored value from the memory block may be scaled with respect to a position of the second plurality of bits from the second number and a position of the second plurality of bits from the second number. In an embodiment where the first and second plurality of bits from the first number and the first and second plurality of bits from the second number represent all the bits from the first and second number, the scaled product and the scaled stored value may be summed to generate a result that is equivalent to a product of the first and second number. In an embodiment where the first and second plurality of bits from the first number and the first and second plurality of bits from the second number do not represent all the bits from the first and second number, additional memory blocks may be used to generate additional decomposition products that may be scaled and summed to generate a result equivalent to the product of the first and second number.

Figure 2:
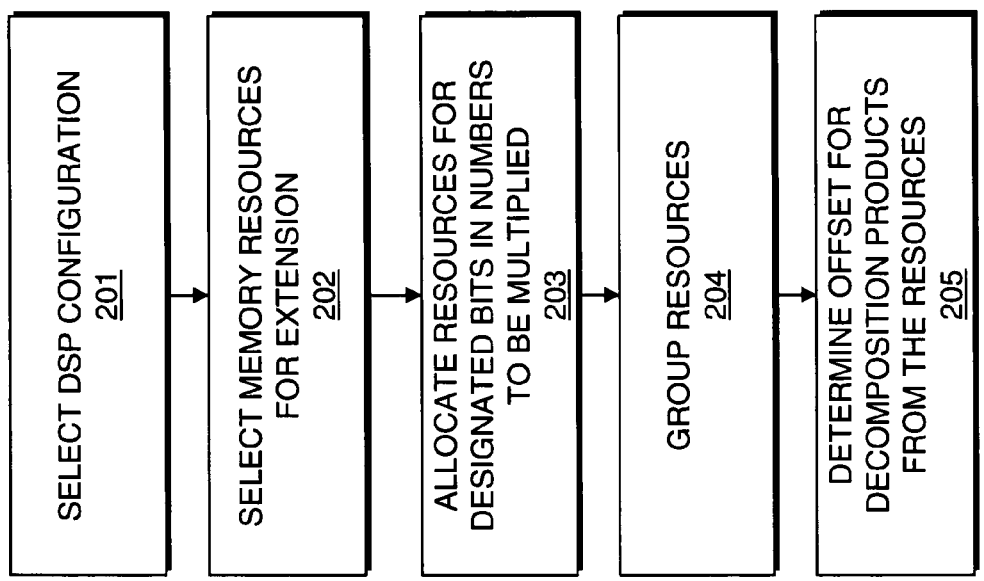
FIG. 2 is a flow chart illustrating a method for implementing a multiplier on a FPGA according to an embodiment of the present invention.

FIG. 2 is a flow chart illustrating a method for implementing a multiplier on a FPGA according to an embodiment of the present invention. At 201, a DSP configuration is selected. The DSP configuration determines the number of bits that are to be supported by a DSP block for multiplication. In one embodiment, the largest dimension supported by the DSP block that is under the desired multiplier configuration is selected. It should be appreciated that if the largest dimension supported by the DSP block that is under the desired multiplier configuration is not available, a smaller dimension supported by the DSP block may also be selected. The DSP block may be configured to generate a product by performing multiplication on a first plurality of bits from a first number and a first plurality of bits from a second number.

At 202, one or more memory resources are selected for memory extension. According to an embodiment of the present invention, a capacity of the memory extension is determined. The capacity of the memory extension is determined based upon the DSP configuration selected and the desired multiplier configuration. The type of the one or more memory resources selected for the memory extension may be determined based upon the capacity of the memory extension and the storage capacity of the available memory resources available on the FPGA. It should be appreciated that other resources, such as registers, may also be selected to facilitate extension.

At 203, resources are allocated for designated bits in the numbers to be multiplied. According to an embodiment of the present invention, it is determined which bits in the numbers to be multiplied are to be processed by the DSP block and which bits in the numbers to be multiplied are to have values representing their products stored in the memory resources. According to an embodiment of the present invention, allocating resources for designated bits in numbers to be multiplied may be achieved by utilizing a multiplier bit map.

Figure 3:
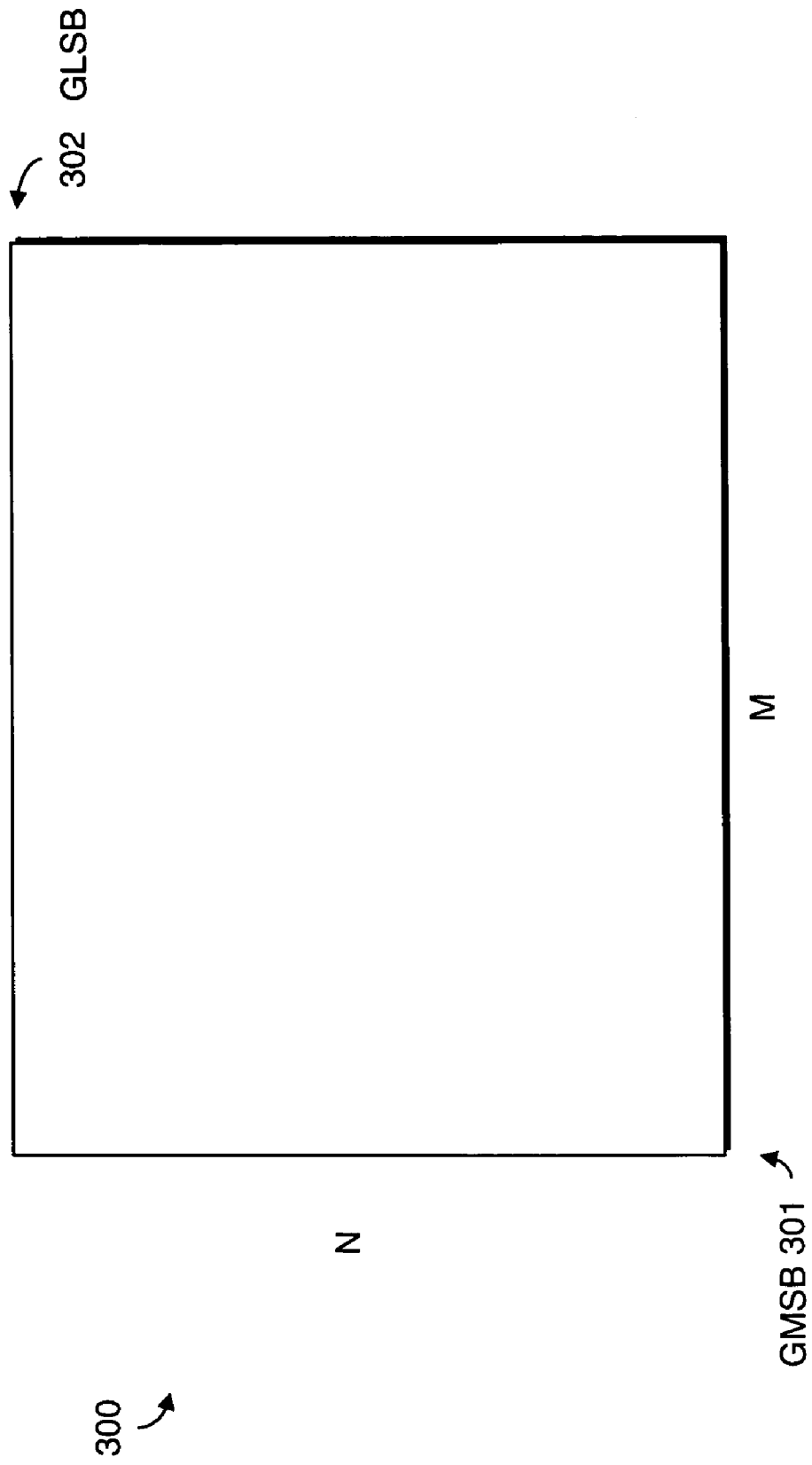
FIG. 3 illustrates a exemplary multiplier bit map frame according to an embodiment of the present invention.

FIG. 3 illustrates an exemplary multiplier bit map frame 300 according to an embodiment of the present invention. The multiplier bit map frame 300 is for a m*n bit multiplier configuration. The multiplier bit map 300 may be used to map out the bit designation for a first number and a second number to be multiplied. The multiplier bit map frame 300 has a horizontal dimension of m bits and a vertical dimension of n bits. The first number may be mapped along the horizontal dimension of the multiplier bit map frame 300 with its most significant bit at the left most side of the horizontal dimension of the multiplier bit map frame 300 and its least significant bit at the right most side of the horizontal dimension of the multiplier bit map frame 300. The second number may be mapped along the vertical dimension of the multiplier bit map frame 300 with its most significant bit at the bottom most side of the multiplier bit map frame 300 and its least significant bit at the top most side of the vertical dimension of the multiplier bit map frame 300. According to one embodiment a global least significant bit (GLSB) is designated at the upper right corner 301 of the multiplier bit map frame 300 and a global most significant bit (GMSB) is designated at the lower left corner 302 of the multiplier bit map frame 300.

Referring back to FIG. 2, at 204, the resources are grouped together to form a multiplier. According to an embodiment of the present invention, grouping together the resources determines a number of adders to implement in the multiplier.

At 205, offsets are determined for the decomposition products from the resources. Because decomposition products represent the products of subsets of bits from the first number and subsets of bits from the second number, the decomposition products need to be scaled to reflect their true values. Offsets may be used to scale the decomposition products. According to an embodiment of the present invention, an offset for a decomposition value may be determined from the position of its corresponding subset of bits from the first number and the position of its corresponding subset of bits from the second number.

Figure 4:
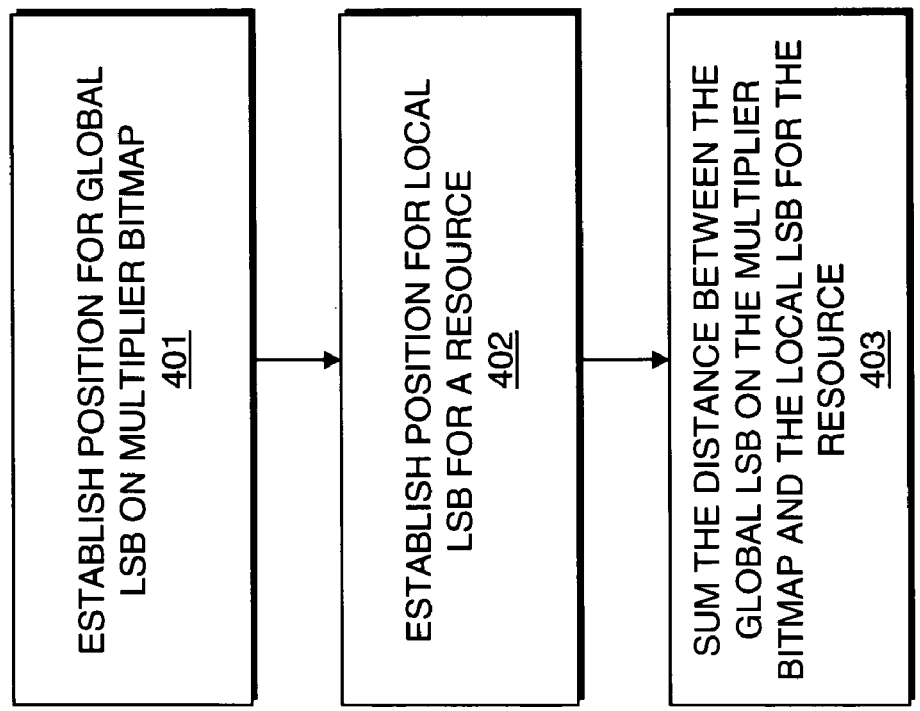
FIG. 4 is a flow chart illustrating a method for determining an offset for a decomposition product according to an embodiment of the present invention.

FIG. 4 is a flow chart illustrating a method for determining an offset for a decomposition product according to an embodiment of the present invention. The procedure illustrated may be used to implement 205 in FIG. 2. At 401, a position for a global least significant bit is established on a multiplier bit map. According to an embodiment of the present invention, the position for the global least significant bit is the relative position on the multiplier bit map where the least significant bit of the numbers to be multiplied is directed. In one embodiment, the global least significant bit is established on the top right corner of the multiplier bit map.

At 402, a position for a local most significant bit is established for a resource on the multiplier bit map. According to an embodiment of the present invention, the position for the local most significant bit for a resource is a relative position on the resource where the least significant bit of the numbers to be processed or stored is directed. In one embodiment, the local least significant bit is established on the top right corner of the resource.

At 403, the vertical and horizontal distance between the global least significant bit on the multiplier bitmap and the local least significant bit for a resource is summed.

An example of implementing a 12*10 bit dimension multiplier on a FPGA is illustrated with reference to FIG. 2 according to an embodiment of the present invention. At 201, a DSP configuration is selected. In an example where a DSP block may be configured to support the fixed configurations of only 9*9 bit, 18*18 bit, and 36*36 bit multiplication, the 9*9 bit configuration is selected.

At 202, memory resources are selected for memory extension. The capacity of the memory extension is determined based upon the DSP configuration selected and the multiplier configuration desired. For a 9*9 bit configuration selected on a DSP block for a 12*10 bit multiplier configuration, a memory extension is required to be able to store values representing combinations of multiplying a 3 bit binary number with a 10 bit binary number for a first dimension. The memory extension is also required to be able to store values representing combinations of multiplying a 12 bit binary number with a 1 bit binary number for a second dimension. A first and second memory block each capable of storing 256*8 bits may be used to store values representing combinations of multiplying a 3 bit binary number with a 10 bit binary number for the one dimension and to store values representing combinations of multiplying a 3 bit binary number with a 1 bit binary number for the second dimension. A 9-bit register may be used to store values representing combinations of multiplying a 9 bit binary number with a 1 bit binary number for the second dimension. It should be appreciated that a third memory block may be implemented instead of the 9-bit register.

At 203, resources are allocated for designated bits in numbers to be multiplied. It is determined which of the bits in the numbers to be multiplied are to be processed by the DSP block and which bits in the numbers to be multiplied are to have values representing their products stored in the memory resources.

Figure 5:
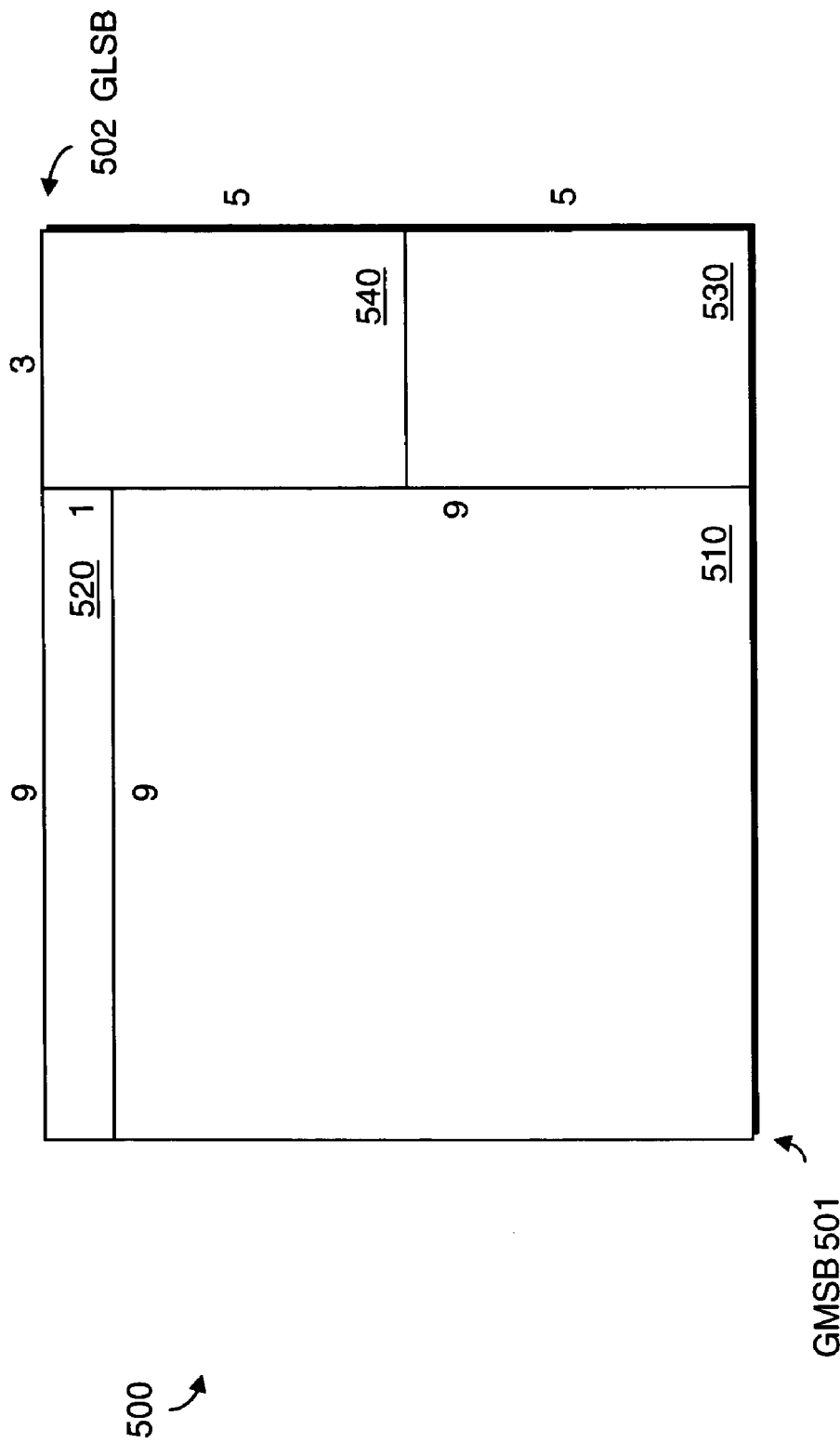
FIG. 5 illustrates an exemplary multiplier bit map for a 10*12 multiplier according to an embodiment of the present invention.

FIG. 5 illustrates an exemplary multiplier bit map 500 for a 10*12 multiplier configuration according to a first embodiment of the present invention. As mapped on the multiplier bit map 500, a DSP block 510 that is configured to support 9*9 bit multiplication is designated to multiply the 9 most significant bits of a first number with the 9 most significant bits of the second number. A 9-bit register 520 is configured to latch the 9 most significant bits of the first number if the least significant bit of the second number is 1. A first memory block 530 is configured to store values that represent all the combinations of multiplying the 3 least significant bits of the first number with the 5 most significant bits of the second number. A second memory block 540 is configured to store values that represent all combinations of multiplying the 3 least significant bits of the first number with the 5 least significant bits of the second number.

Figure 6:
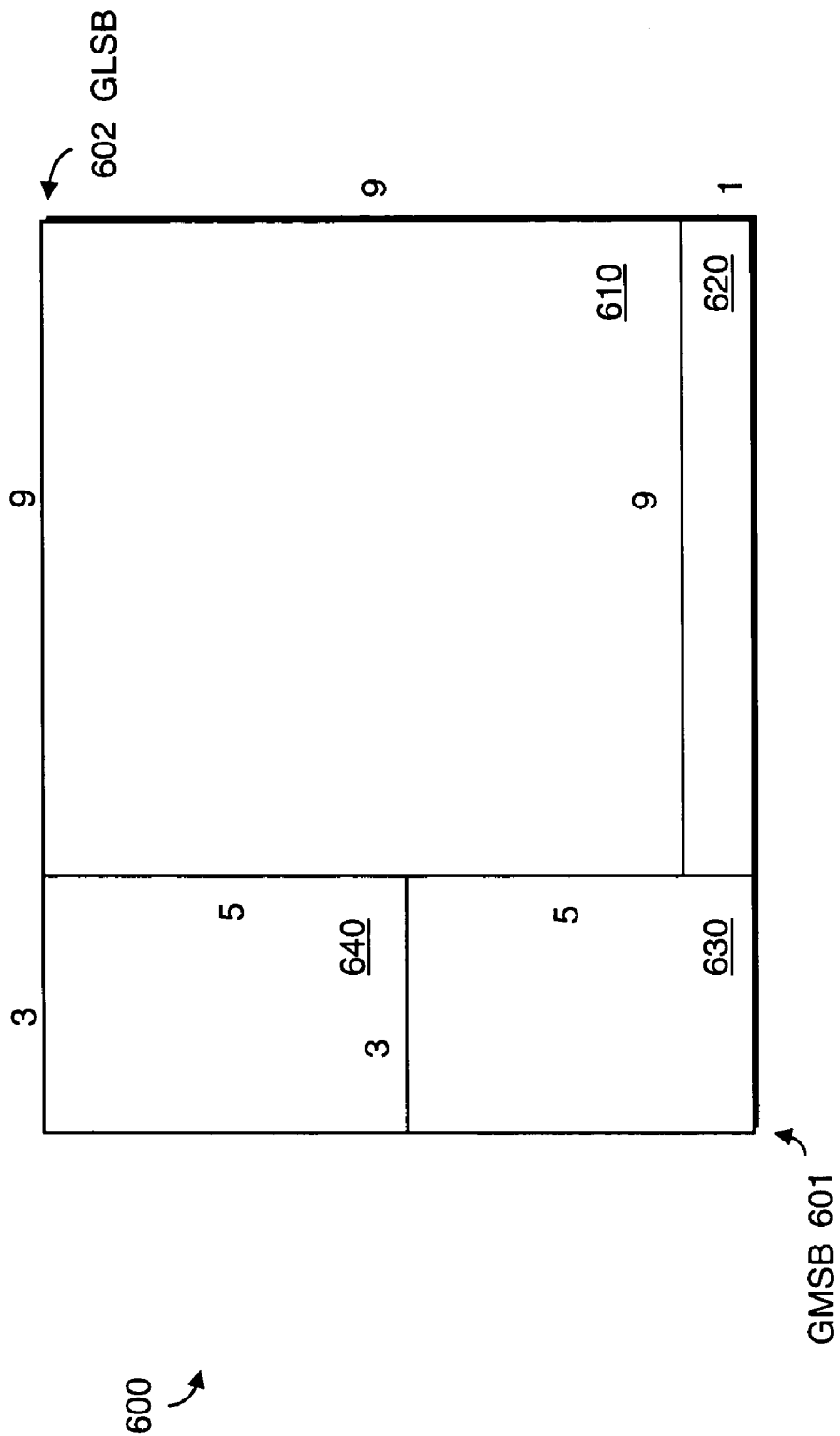
FIG. 6 illustrates an exemplary multiplier bit map for a 10*12 multiplier according to a second embodiment of the present invention.

FIG. 6 illustrates an exemplary multiplier bit map 600 for a 10*12 multiplier configuration according to a second embodiment of the present invention. As mapped on the multiplier bit map 600, a DSP block 610 that is configured to support 9*9 bit multiplication is designated to multiply the 9 least significant bits of a first number with the 9 least significant bits of the second number. A 9-bit register 620 is configured to latch the 9 least significant bits of the first number if the most significant bit of the second number is 1. A first memory block 630 is configured to store values that represent all the combinations of multiplying the 3 most significant bits of the first number with the 5 most significant bits of the second number. A second memory block 640 is configured to store values that represent all combinations of multiplying the 3 most significant bits of the first number with the 5 least significant bits of the second number.

Referring back to FIG. 2, at 204, the resources are grouped together to form a multiplier. According to an embodiment of the present invention, grouping together the resources determines a number of adders to implement in the multiplier.

Figure 7:
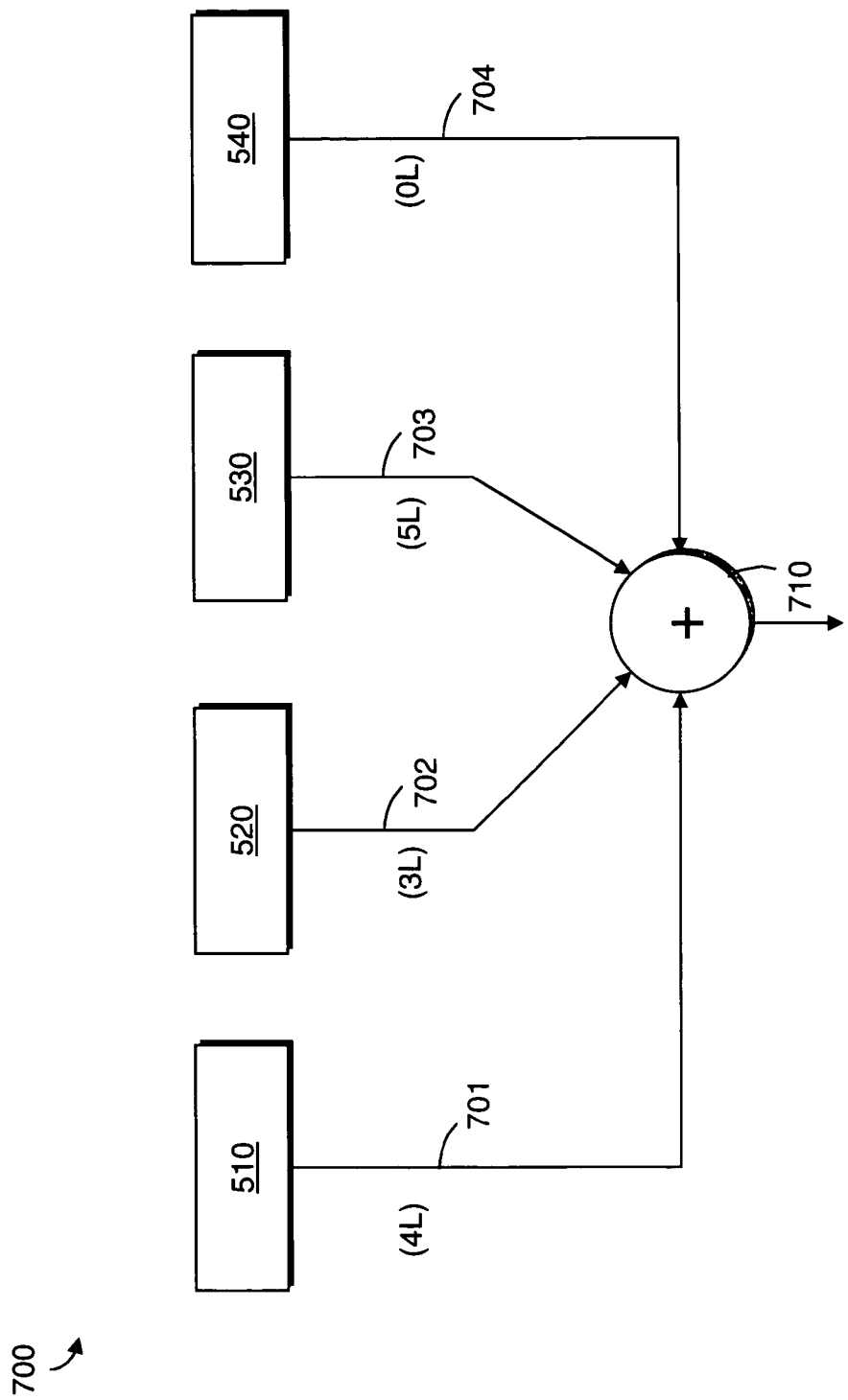
FIG. 7 illustrates an exemplary multiplier that may be implemented using the multiplier bit map shown in FIG. 5 according to an embodiment of the present invention.

FIG. 7 illustrates an exemplary multiplier 700 that may be implemented according to the multiplier bit map shown in FIG. 5 according to an embodiment of the present invention. The multiplier 700 routes the output of the DSP block 510, the shift register 520, the first memory block 530, and the second memory block 540 to an adder 710.

Figure 8:
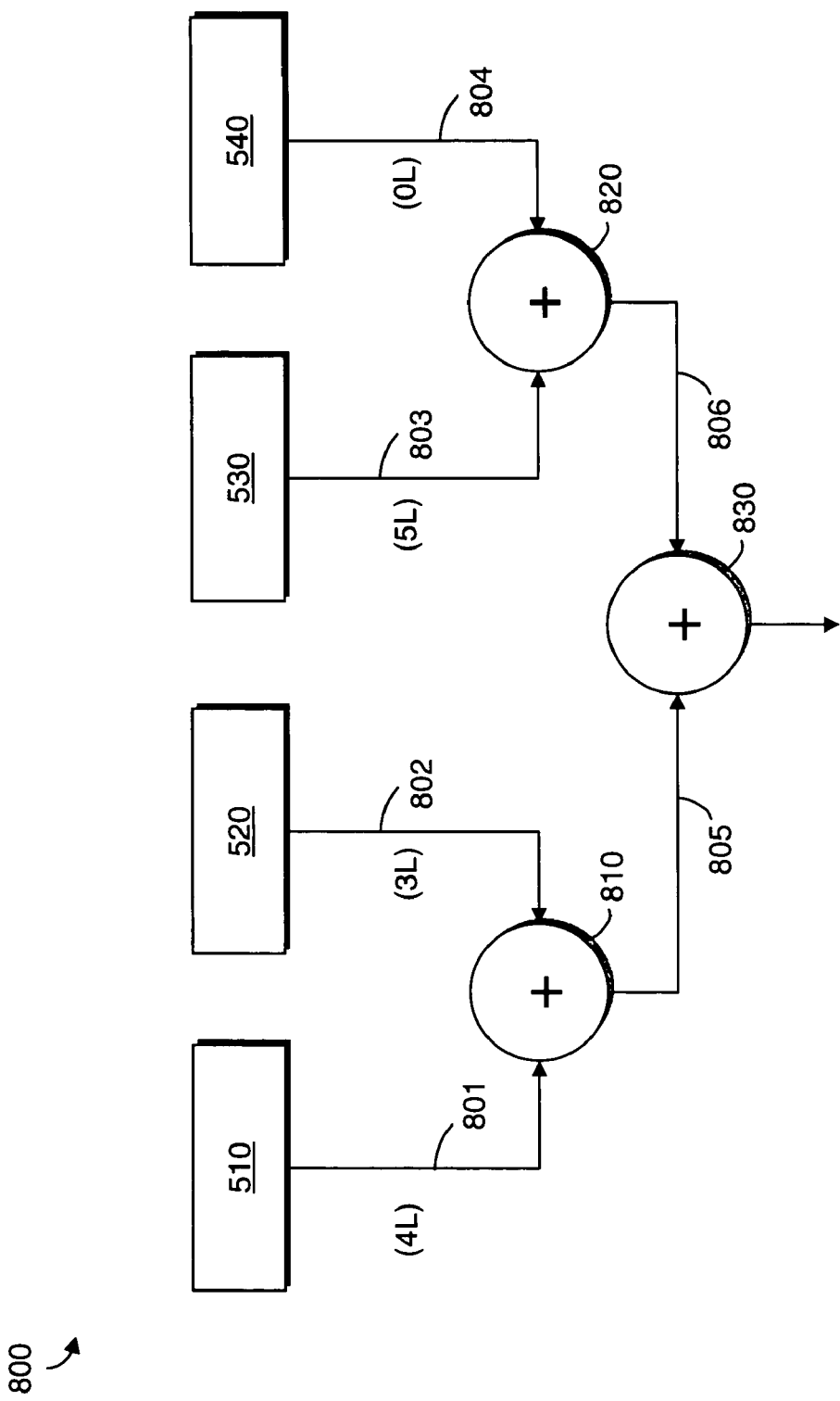
FIG. 8 illustrates an exemplary multiplier that may be implemented using the multiplier bit map shown in FIG. 5 according to a second embodiment of the present invention.

FIG. 8 illustrates an exemplary multiplier 800 that may be implemented according to the multiplier bit map shown in FIG. 5 according to a second embodiment of the present invention. The multiplier 800 routes the output of the DSP block 510 and the output of the shift register 520 to a first adder 810. The multiplier 800 routes the output of the first memory block 530 and the output of the second memory block 540 to an adder 820. The multiplier 800 routes the output of the first and second adders 810 and 820 to a third adder 830.

Figure 9:
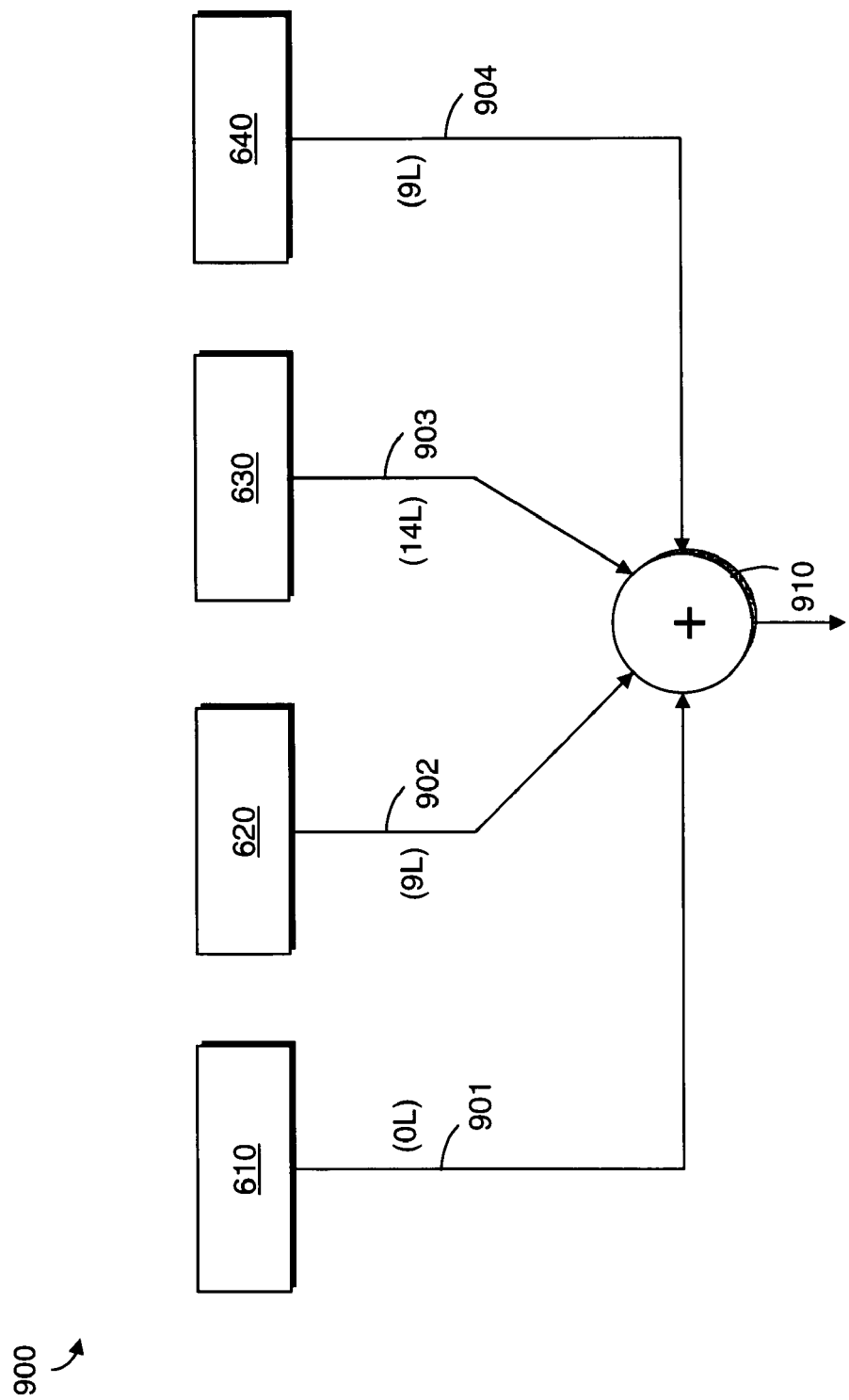
FIG. 9 illustrates an exemplary multiplier that may be implemented using the multiplier bit map shown in FIG. 6 according to an embodiment of the present invention.

FIG. 9 illustrates an exemplary multiplier 900 that may be implemented according to the multiplier bit map shown in FIG. 6 according to an embodiment of the present invention.

The multiplier 900 routes the output of the DSP block 610, the shift register 620, the first memory block 630, and the second memory block 640 to an adder 910.

Figure 10:
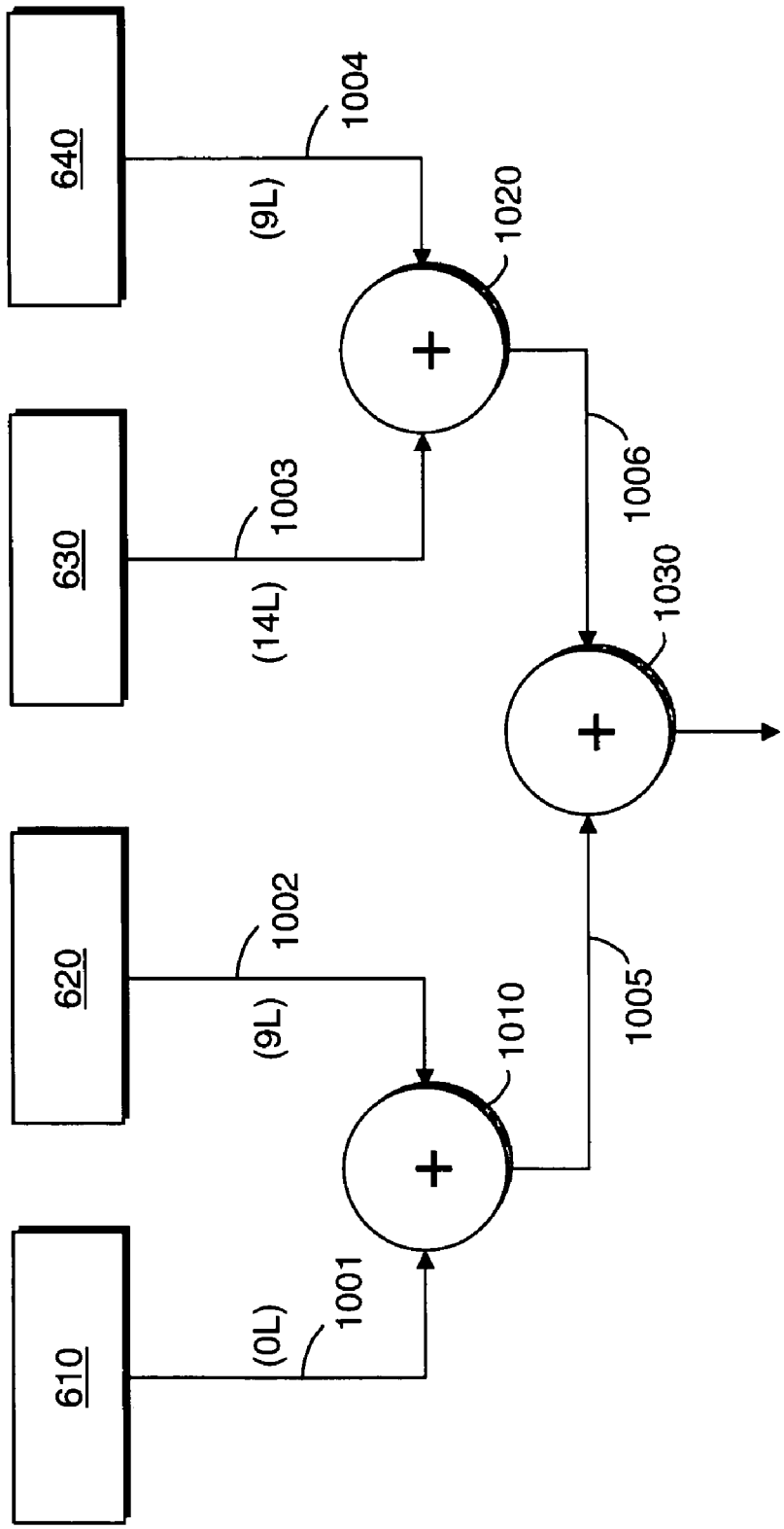
FIG. 10 illustrates an exemplary multiplier that may be implemented using the multiplier bit map shown in FIG. 6 according to a second embodiment of the present invention.

FIG. 10 illustrates an exemplary multiplier 1000 that may be implemented according to the multiplier bit map shown in FIG. 6 according to a second embodiment of the present invention. The multiplier 1000 routes the output of the DSP block 610 and the output of the register 620 to a first adder 1010. The multiplier 1000 routes the output of the first memory block 630 and the output of the second memory block 640 to an adder 1020. The multiplier 1000 routes the output of the first and second adders 1010 and 1020 to a third adder 1030.

At 205, offsets are determined for the decomposition products from the resources.

Referring back to FIG. 5, the vertical and horizontal distances from the local least significant bit of DSP block 510 to the global least significant bit of the multiplier bit map 502 are 1 and 3, making the offset for the DSP block 510 4. The vertical and horizontal distances from the local least significant bit of shift register 520 to the global least significant bit of the multiplier bit map 502 are 0 and 3, making the offset for the shift register 520 3. The vertical and horizontal distances from the local least significant bit of the first memory block 530 to the global least significant bit of the multiplier bit map 502 are 5 and 0, making the offset for the first memory block 530 5. The vertical and horizontal distances from the local least significant bit of the second memory block 540 to the global least significant bit of the multiplier bit map 502 are 0 and 0, making the offset for the second memory block 540 0.

The offsets determined from the multiplier bit map 500 are indicated in the multipliers shown in FIGS. 7 and 8. Referring back to FIG. 7, the output from DSP block 510 is to be scaled 4 bits to the left (4 L). The output from the register 520 is to be scaled 3 bits to the left (3 L). The output from the first memory block 530 is to be scaled 5 bits to the left (5 L). The output from the second memory block 540 need not be scaled (0 L). It should be appreciated that scaling the outputs from components 510, 520, 530, and 540 may be achieved by routing the outputs on routing resources 701-704, respectively to the adder 710 at inputs of appropriate significance. In this embodiment, additional resources for shifting the bits of the outputs are not required.

Referring back to FIG. 8, the output from DSP block 510 is similarly scaled 4 bits to the left (4 L). The output from the shift register 520 is to be scaled 3 bits to the left (3 L). The output from the first memory block 530 is to be scaled 5 bits to the left (5 L). The output from the second memory block 540 need not be scaled (0 L). It should be appreciated that scaling the outputs from components 510 and 520 may be achieved by routing the outputs on routing resources 801 and 802, respectively to the adder 810 at inputs of appropriate significance. Similarly, scaling the outputs from components 530 and 540 may be achieved by routing the outputs on routing resources 803 and 804 to the adder 820 at inputs of appropriate significance. In this embodiment, additional resources for shifting the bits of the outputs are not required.

Referring back to FIG. 6, the vertical and horizontal distances from the local least significant bit of DSP block 610 to the global least significant bit of the multiplier bit map 602 are 0 and 0, making the offset for the DSP block 610 0. The vertical and horizontal distances from the local least significant bit of shift register 620 to the global least significant bit of the multiplier bit map 602 are 9 and 0, making the offset for the shift register 620 9. The vertical and horizontal distances from the local least significant bit of the first memory block 630 to the global least significant bit of the multiplier bit map 602 are 5 and 9, making the offset for the first memory block 630 14. The vertical and horizontal distances from the local least significant bit of the second memory block 640 to the global least significant bit of the multiplier bit map 602 are 0 and 9, making the offset for the second memory block 640 9.

The offsets determined from the multiplier bit map 600 are indicated in the multipliers shown in FIGS. 9 and 10. Referring back to FIG. 9, the output from DSP block 610 is to be scaled 4 bits to the left (4 L). The output from the shift register 620 is to be scaled 3 bits to the left (3 L). The output from the first memory block 630 is to be scaled 5 bits to the left (5 L). The output from the second memory block 640 need not be scaled (0 L). It should be appreciated that scaling the outputs from components 610, 620, 630, and 640 may be achieved by routing the outputs on routing resources 901-904, respectively to the adder 910 at inputs of appropriate significance. In this embodiment, additional resources for shifting the bits of the outputs are not required.

Referring back to FIG. 10, the output from DSP block 610 is similarly scaled 4 bits to the left (4 L). The output from the shift register 620 is to be scaled 3 bits to the left (3 L). The output from the first memory block 630 is to be scaled 5 bits to the left (5 L). The output from the second memory block 640 need not be scaled (0 L). It should be appreciated that scaling the outputs from components 610 and 620 may be achieved by routing the outputs on routing resources 1001 and 1002, respectively to the adder 1010 at inputs of appropriate significance. Similarly, scaling the outputs from components 630 and 640 may be achieved by routing the outputs on routing resources 1003 and 1004 to the adder 1020 at inputs of appropriate significance. In this embodiment, additional resources for shifting the bits of the outputs are not required.

FIGS. 8 and 10 illustrate multipliers that fully scale decomposition products prior to performing a first stage of additions. It should be appreciated that where a multiplier has more than one stage of addition, the scaling may be divided among the available stages. For example, in FIG. 8, the output from the DSP block 510 may be scaled 1 bit to the left (1 L) and the output of the adder 810 may be scaled 3 bits to the left (3 L).

Referring back to FIG. 7, multiplier 700 may be used to multiply the numbers 100110010100 and 1000101101. DSP block 510 multiplies 101001100 with 100010110 to generate the product 10100110001001100, which is a first decomposition product. Shift register 520 shifts out a value 100110010, which is a second decomposition product. First memory block 530 transmits stored value 1000100, an equivalent value to the product of 100 and 10001, which is a third decomposition product. Second memory block 540 transmit stored value 110100, an equivalent value to the product of 100 and 01101, which is a fourth decomposition product. Line 701 routes the output from DSP block 510 to adder 710 such that the first decomposition product is scaled to 101001100010011000000. Line 702 routes the output from the register 520 to adder 710 such that the second decomposition product is scaled to 100110010000. Line 703 routes the output from the first memory block 530 to adder 710 such that the third decomposition product is scaled to 100010000000. Line 704 routes the output from the second memory block 540 to adder 710 such that the fourth decomposition product is scaled to 110100. The adder 710 sums the decomposition products to generate the value 101001101011100000100.

Referring back to FIG. 8, multiplier 800 may be used to multiply the numbers 100110010100 and 1000101101. DSP block 510 multiplies 101001100 with 100010110 to generate the product 10100110001001100, which is a first decomposition product. The register 520 shifts out a value 100110010, which is a second decomposition product. First memory block 530 transmits stored value 1000100, an equivalent value to the product of 100 and 10001, which is a third decomposition product. Second memory block 640 transmit stored value 110100, an equivalent value to the product of 100 and 01101, which is a fourth decomposition product. Line 801 routes the output from DSP block 510 to adder 810 such that the first decomposition product is scaled to 101001100010011000000. Line 802 routes the output from the register 520 to adder 810 such that the second decomposition product is scaled to 100110010000. Line 803 routes the output from the first memory block 530 to adder 820 such that the third decomposition product is scaled to 100010000000. Line 804 routes the output from the second memory block 540 to adder 810 such that the fourth decomposition product is scaled to 110100. The adder 810 sums the decomposition products to generate the value 101001100111001010000. The adder 820 sums the decomposition products to generate the value 100010110100. Line 805 routes the output from adder 810 to the adder 830. Line 806 routes the output from adder 820 to the adder 830. The adder 830 sums the decomposition products to generate the value 101001101011100000100.

FIGS. 2 and 4 are flow charts illustrating embodiments of the present invention. Some of the procedures illustrated in the figures may be performed sequentially, in parallel or in an order other than that which is described. It should be appreciated that not all of the procedures described are required, that additional procedures may be added, and that some of the illustrated procedures may be substituted with other procedures.

FIGS. 5 and 6 illustrate exemplary multiplier bit maps for a 10*12 multiplier configuration according to embodiments of the present invention. It should be appreciated that other multiplier bit maps may be generated using the techniques described and that a different allocation of resources on the FPGA may be made to designated bits in the numbers to be multiplied. FIGS. 7 and 8 illustrate multipliers that may be implemented according to the multiplier bit map shown in FIG. 5 and FIGS. 9 and 10 illustrate multipliers that may be implemented according to the multiplier bit map shown in FIG. 6. It should be appreciated that the multipliers disclosed are exemplary multipliers and that other multipliers may be configured according to the multiplier bit maps shown in FIGS. 5 and 6.

The techniques described herein are not limited to any particular hardware or software configuration. They may find applicability in any computing or processing environment. The techniques may be implemented in hardware, software, or a combination of the two. The techniques may be implemented in programs executing on programmable machines such as mobile or stationary computers, and other electronic devices, that each include a processor, a storage medium readable by the processor (including volatile and non-volatile memory and/or storage elements). One of ordinary skill in the art may appreciate that the embodiments of the present invention can be practiced with various computer system configurations, including multiprocessor systems, minicomputers, mainframe computers, and other systems. The embodiments of the present invention can also be practiced in distributed computing environments where tasks may be performed by remote processing devices that are linked through a communications network.

Program instructions may be used to cause a general-purpose or special-purpose processing system that is programmed with the instructions to perform the operations described herein. Alternatively, the operations may be performed by specific hardware components that contain hardwired logic for performing the operations, or by any combination of programmed computer components and custom hardware components. The methods described herein may be provided as a computer program product that may include a machine readable medium having stored thereon instructions that may be used to program a processing system or other electronic device to perform the methods. The term "machine readable medium" used herein shall include any medium that is capable of storing or encoding a sequence of instructions for execution by the machine and that cause the machine to perform any one of the methods described herein. The term "machine readable medium" shall accordingly include, but not be limited to, solid-state memories, optical and magnetic disks, and a carrier wave that encodes a data signal. Furthermore, it is common in the art to speak of software, in one form or another (e.g., program, procedure, process, application, module, logic, and so on) as taking an action or causing a result. Such expressions are merely a shorthand way of stating that the execution of the software by a processing system causes the processor to perform an action to produce a result.

In the foregoing specification, the embodiments of the present invention have been described with reference to specific exemplary embodiments thereof. It will, however, be evident that various modifications and changes may be made thereto without departing from the broader spirit and scope of the embodiments of the present invention. The specification and drawings are, accordingly, to be regarded in an illustrative rather than restrictive sense.

What is claimed is:

1. A method for performing multiplication of a first number with a second number on a target device, the method comprising:

generating a product by multiplying a first plurality of bits associated with the first number and a first plurality of bits associated with the second number using a single digital signal processor (DSP) where a largest dimension of multiplication supported by the DSP is under that which supports multiplying the first and second numbers;

retrieving a stored value designated as a product of a second plurality of bits associated with the first number and a second plurality of bits associated with the second number from a memory, wherein a number of bits in the second plurality of bits associated with the first number is less than a number of bits of the first number, and wherein a number of bits in the second plurality of bits associated with the second number is less than a number of bits of the second number, wherein the memory resides outside of the DSP;

scaling the product with respect to a position of the first plurality of bits associated with the first number and a position of the first plurality of bits associated with the second number to form a scaled product, and scaling the stored value with respect to a position of the second plurality of bits associated with the first number and a position of the second plurality of bits associated with the second number; and summing the scaled product and the scaled stored value to generate a value representing a product of the first number and the second number, wherein the first number and the second number each have a number of bits equal to or greater than a total of the first and second plurality of bits.

2. The method of claim 1, wherein the DSP is configured to multiply two numbers of equal bit length.

3. The method of claim 1, wherein scaling the product comprises shifting bits in the product relative to a global least significant bit.

4. The method of claim 1, wherein scaling the stored value comprises shifting bits in the product relative to a global least significant bit.

5. The method of claim 1, wherein scaling the product comprises routing the product directly to an adder at inputs of appropriate significance.

6. The method of claim 1, wherein scaling the stored value comprises routing the stored value directly to an adder at inputs of appropriate significance.

7. A method for implementing a multiplier on a target device to perform multiplication of a first number with a second number utilizing a single digital signal processor (DSP), the method comprising:
configuring the DSP to perform multiplication on a first plurality of bits associated with the first number and a first plurality of bits associated with the second number where the first plurality of bits associated with the first and second numbers are less than the bits forming the first and second number;
storing products resulting from multiplication of a second plurality of bits associated with the first number and a second plurality of bits associated with the second number in a memory where the second plurality of bits from the first and second numbers are less than the bits forming the first and second number, wherein the memory resides outside the DSP;
routing an output from the DSP to an adder wherein the output from the DSP is scaled according to a position of the first plurality of bits from the first number and a position of the first plurality of bits from the second number;
routing an output of the memory to the adder wherein the output from the memory is scaled according to a position of the second plurality of bits from the first number and a position of the second plurality of bits from the second number; and
outputting a value representing a product of the first and second number where the first and second number each have more than the first plurality of bits, wherein a largest dimension of multiplication supported by the DSP is under that which supports multiplying the first number with the second number.

8. The method of claim 7, further comprising:
storing products resulting from multiplication of a third plurality of bits from the first number and a third plurality orbits from the second number in a second memory;
storing products resulting from multiplication of a fourth plurality of bits from the first number and a fourth plurality of bits from the second number in a third memory;
routing an output from the second memory to the adder such that the output from the second memory is scaled according to a position of the third plurality of bits from the first number and a position of the third plurality of bits from the second number; and
routing an output of the third memory to the adder such that the output from the memory is scaled according to a position of the fourth plurality of bits from the first number and a position of the fourth plurality of bits from the second number.

9. The method of claim 7, wherein configuring the DSP comprises determining a number of bits that the DSP will multiply.

10. The method of claim 7, further comprising determining a number of the second plurality of bits from the first number and a number of the second plurality of bits from the second number.

11. The method of claim 7, wherein routing the output from the DSP has the effect of shifting the output from the DSP to a more significant bit position.

12. The method of claim 7, wherein routing the output from the memory has the effect of shifting the output from the memory to a more significant bit position.

13. A multiplier to perform multiplication of a first number with a second number, the multiplier comprising:
a digital signal processor (DSP) configured to perform multiplication on a first plurality of bits associated with the first number and a first plurality of bits associated with the second number, wherein a largest dimension of multiplication supported by the DSP is under that which supports multiplying the first number with the second number;
a memory operable to stores products resulting from multiplication of a second plurality of bits associated with the first number and a second plurality of bits associated with the second number where the second plurality of bits from the first number is less than the bits forming the first number and the second plurality of bits from the second number is less than the bits forming the second number wherein the memory resides outside of the DSP; and
an adder operable to sum a scaled output of the DSP and a scaled output of the memory to output a value representing a product of the first and second number where the first and second number each have more than the first plurality of bits.

14. The multiplier of claim 13, wherein the DSP, the memory, and the adder reside on a field programmable gate array.

15. The multiplier of claim 13, further comprising a second memory that stores products resulting from multiplication of a third plurality of bits from the first number and a third plurality of bits from the second number.

16. The multiplier of claim 15, wherein the adder sums a scaled output of the second memory with the scaled output of the DSP and the scaled output of the memory.

17. A method for implementing a multiplier on a target device to perform multiplication of a first number with a second number, the method comprising:
configuring a digital signal processor (DSP) to perform multiplication on a first n bits associated with the first number and a first n bits associated with the second number, wherein a largest dimension multiplier supported by the DSP is an n×n multiplier;
storing products resulting from multiplication of a second m bits associated with the first number and a second m bits associated with the second number in a memory, wherein the memory resides outside of the DSP;
routing an output from the DSP to an adder such that the output from the DSP is scaled according to a position of the first n bits associated with the first number and a position of the first n bits associated with the second number;
routing an output of the memory to the adder such that the output from the memory is scaled according to a position of the second m bits from the first number and a position of the second m bits from the second number; and
outputting a value representing a product of the first and second number where the first and second number each have at least n+m number of bits.

18. A multiplier to perform multiplication of a first number with a second number, the method comprising:
- a digital signal processor (DSP) configured to perform n*n multiplication on a first plurality of n bits associated with the first number and a first plurality of n bits associated with the second number, wherein a largest dimension of multiplication supported by the DSP is under that which supports multiplying the first and second numbers;
- a memory that stores products resulting from multiplication of a second plurality of bits associated with the first number and a second plurality of bits associated with the second number, wherein the memory resides outside of the DSP; and
- an adder that sums a scaled output of the DSP and a scaled output of the memory to output a value representing a product of the first and second number where the first and second number each have more than n bits.

* * * * *